(12) United States Patent
Vukkadala et al.

(10) Patent No.: US 9,707,660 B2
(45) Date of Patent: Jul. 18, 2017

(54) PREDICTIVE WAFER MODELING BASED FOCUS ERROR PREDICTION USING CORRELATIONS OF WAFERS

(71) Applicant: KLA-Tencor Corporation, Milpitas, CA (US)

(72) Inventors: Pradeep Vukkadala, Fremont, CA (US); Jaydeep Sinha, Livermore, CA (US); Wei Chang, Foster City, CA (US); Krishna Rao, San Ramon, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 520 days.

(21) Appl. No.: 14/457,706

(22) Filed: Aug. 12, 2014

(65) Prior Publication Data

US 2015/0302312 A1 Oct. 22, 2015

Related U.S. Application Data

(60) Provisional application No. 61/982,731, filed on Apr. 22, 2014.

(51) Int. Cl.
| | | |
|---|---|---|
| *G06F 15/18* | (2006.01) |
| *B24B 37/005* | (2012.01) |
| *B24B 49/00* | (2012.01) |
| *G03F 7/20* | (2006.01) |
| *G01B 21/00* | (2006.01) |

(Continued)

(52) U.S. Cl.
CPC ............ *B24B 37/005* (2013.01); *B24B 49/00* (2013.01); *G01B 21/00* (2013.01); *G03F 7/705* (2013.01); *G03F 9/7026* (2013.01);
*G06N 7/00* (2013.01); *G06N 99/005* (2013.01); *G01B 2210/48* (2013.01)

(58) Field of Classification Search
CPC ........................................................ G03F 7/705
USPC ........................................................ 706/12, 45
See application file for complete search history.

(56) References Cited

U.S. PATENT DOCUMENTS

| | | | |
|---|---|---|---|
| 9,087,176 B1 * | 7/2015 | Chang .................. G06F 17/5081 |
| 2003/0041798 A1 * | 3/2003 | Wenski .................... C30B 25/02 |
| | | | 117/84 |

(Continued)

OTHER PUBLICATIONS

Vukkadala et al., Impact of Wafer Geometry on CMP for Advanced Nodes, 2011, Journal of The Eletrochemical Society, pp. 1-8.*

(Continued)

*Primary Examiner* — David Vincent
(74) *Attorney, Agent, or Firm* — Suiter Swantz pc llo

(57) ABSTRACT

Predictive modeling based focus error prediction method and system are disclosed. The method includes obtaining wafer geometry measurements of a plurality of training wafers and grouping the plurality of training wafers to provide at least one training group based on relative homogeneity of wafer geometry measurements among the plurality of training wafers. For each particular training group of the at least one training group, a predictive model is develop utilizing non-linear predictive modeling. The predictive model establishes correlations between wafer geometry parameters and focus error measurements obtained for each wafer within that particular training group, and the predictive model can be utilized to provide focus error prediction for an incoming wafer belonging to that particular training group.

28 Claims, 4 Drawing Sheets

(51) Int. Cl.
*G06N 7/00* (2006.01)
*G06N 99/00* (2010.01)
*G03F 9/00* (2006.01)

(56) References Cited

U.S. PATENT DOCUMENTS

| | | | |
|---|---|---|---|
| 2005/0089768 A1 | 4/2005 | Tanaka et al. | |
| 2008/0077256 A1* | 3/2008 | Muenz | G05B 13/024 700/30 |
| 2008/0131796 A1 | 6/2008 | Werner et al. | |
| 2009/0063378 A1 | 3/2009 | Izikson | |
| 2010/0112467 A1* | 5/2010 | Chung | G03B 27/52 430/30 |
| 2010/0224964 A1* | 9/2010 | Passek | C30B 29/06 257/618 |
| 2013/0028517 A1* | 1/2013 | Yoo | G06K 9/00375 382/173 |
| 2013/0089935 A1* | 4/2013 | Vukkadala | G01B 9/02021 438/5 |
| 2013/0304399 A1* | 11/2013 | Chen | G06T 7/0004 702/40 |
| 2014/0037187 A1 | 2/2014 | Marcuccilli et al. | |
| 2014/0075399 A1 | 3/2014 | Cho et al. | |
| 2014/0114597 A1* | 4/2014 | Chen | G01B 11/24 702/84 |

OTHER PUBLICATIONS

Braha et al., Data Mining for Improving a Cleaning Process in the Semiconductor Industry, 2002, IEEE, pp. 91-101.*
PCT International Search Report for PCT International Application No. PCT/US2015/027254, Mail Date Jul. 31, 2015, 3 pages.
R. Brinkhof et al., Wafer Geometry and Lithography Focus Performance for Advanced Nodes—Preliminary Results, SEMI International Standards, AWG, SEMICON West, Jul. 11, 2011, 20 pages.
John Valley et al., Approaching New Metrics for Wafer Flatness: An Investigation of the Lithographic Consequences of Wafer Non-Flatness, Metrology, Inspection, and Process Control for Microlithography XVIII, edited by Richard M. Silver, Proceedings of SPIE, vol. 5375 (SPIE, Bellingham, WA, 2004), pp. 1098-1108.

* cited by examiner

PREDICTIVE WAFER MODELING BASED FOCUS ERROR PREDICTION USING CORRELATIONS OF WAFERS

CROSS-REFERENCE TO RELATED APPLICATIONS

The present application claims the benefit under 35 U.S.C. §119(e) of U.S. Provisional Application Ser. No. 61/982,731, filed Apr. 22, 2014. Said U.S. Provisional Application Ser. No. 61/982,731 is hereby incorporated by reference in its entirety.

TECHNICAL FIELD

The disclosure generally relates to the field of semiconductors, and particularly to wafer geometry measurement techniques.

BACKGROUND

Fabricating semiconductor devices typically includes processing a substrate such as a semiconductor wafer using a number of semiconductor fabrication processes. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

SUMMARY

The present disclosure is directed to a predictive modeling based focus error prediction method. The method includes: obtaining wafer geometry measurements of a plurality of training wafers; grouping the plurality of training wafers to provide at least one training group based on relative homogeneity of wafer geometry measurements among the plurality of training wafers; for each particular training group of the at least one training group, developing a predictive model for that particular training group utilizing non-linear predictive modeling, the predictive model establishing correlations between wafer geometry parameters and focus error measurements obtained for each wafer within that particular training group; and utilizing the predictive model developed for a particular training group of the at least one training group to provide focus error prediction for an incoming wafer belonging to that particular training group.

A further embodiment of the present disclosure is directed to a grouping method. The method includes: obtaining wafer geometry measurements of a plurality of wafers; calculating correlations between each pair of wafers within the plurality of wafers to generate a pair-wise correlation matrix based on wafer geometry measurements; converting the pair-wise correlation matrix to a binary relationship matrix based on whether each pair-wise correlation is greater than a predetermined similarity threshold; dividing the plurality of wafers into a plurality of wafer groups based on relative homogeneity among the plurality of wafers, further comprising: identifying a maximal sub matrix containing all binary values of one from the binary relationship matrix; identifying the wafers corresponding to the identified maximal sub matrix as being in a homogenous group; removing the identified maximal sub matrix from the binary relationship matrix; and repeating the steps of: identifying a maximal sub matrix containing all binary values of one from the binary relationship matrix and identifying the wafers corresponding to the identified maximal sub matrix as being in a homogenous group.

An additional embodiment of the present disclosure is directed to a system. The system includes a wafer geometry measurement tool configured to obtain wafer geometry measurements of a plurality of training wafers. The system also includes a processor in communication with the wafer geometry measurement tool. The processor is configured to: group the plurality of training wafers to provide at least one training group based on relative homogeneity of wafer geometry measurements among the plurality of training wafers; for each particular training group of the at least one training group, develop a predictive model for that particular training group utilizing non-linear predictive modeling, wherein the predictive model establishes correlations between wafer geometry parameters and focus error measurements obtained for each wafer within that particular training group; and utilize the predictive model developed for a particular training group of the at least one training group to provide focus error prediction for an incoming wafer belonging to that particular training group.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Lithography is a process of using light to transfer a pattern from a photomask to a substrate (e.g., a polished wafer). The wafer is typically held on a vacuum or a chuck using force when it is processed by a lithography process tool. It is noted that when the wafer is held on a chuck using force, the shape of the wafer may change and focus errors (may also be referred to as defocus) may occur as a result.

It is noted that focus error contribution from wafer geometry may be predicted from wafer geometry measurements and in particular wafer flatness. However, the accuracy of the predicted focus errors may be limited if the wafer geometry measurements are not accurate and/or if a simplified model is used to model the wafer chucking process. Improving the accuracy of focus error prediction/estimation is important.

Embodiments of the present disclosure are directed to systems and methods using predictive modeling for providing improved focus error prediction/estimation by taking into consideration various wafer geometry measurements. It is noted that the term wafer geometry in the present disclosure includes wafer front side height, backside height, thickness variation, flatness, and all consequent derivatives such as shape, topography, or the like.

Figure 1:
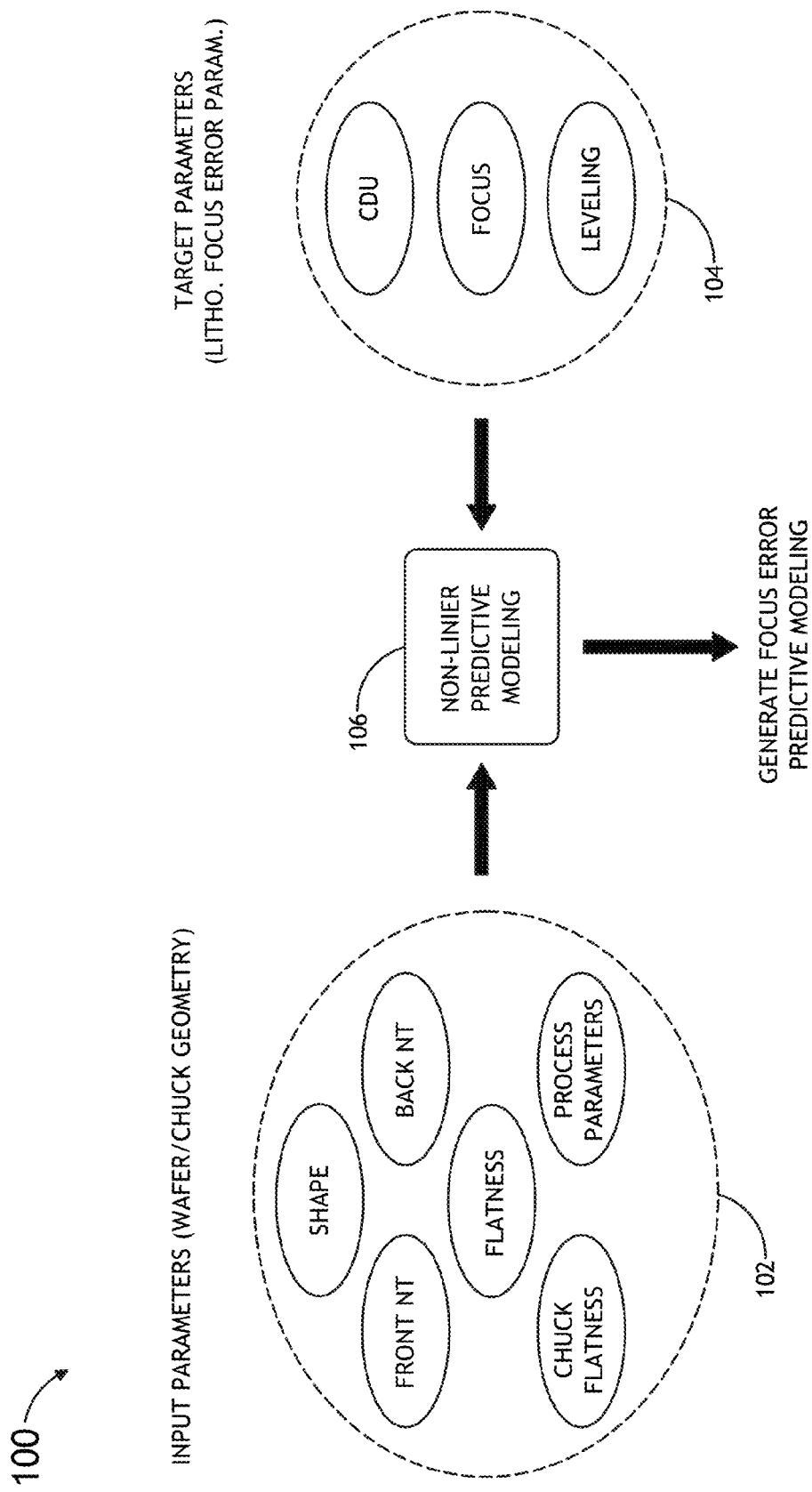
FIG. 1 is an illustration depicting a predictive modeling based focus error prediction system.

FIG. 1 is an illustration depicting a predictive modeling based focus error prediction system 100 in accordance with one embodiment of the present invention. Focus error prediction can be provided by taking measurements on both wafer geometry 102 and actual focus errors measurements 104 (e.g., critical dimension uniformity or scanner leveling) from an initial training set of wafers as input to a predictive modeling engine 106. Subsequently, the predictive modeling engine 106 can be utilized to develop a mapping between wafer geometry/chuck-flatness and focus errors for the initial training set. Once this mapping is developed and stored in a computing device, this mapping can be utilized to process wafer geometry measurements of a given wafer (outside the training set) and provide focus error predictions for that given wafer. It is contemplated that the predicted errors may be utilized for lithography focus control, CMP, as well as other semiconductor process control scanner corrections.

Figure 2:
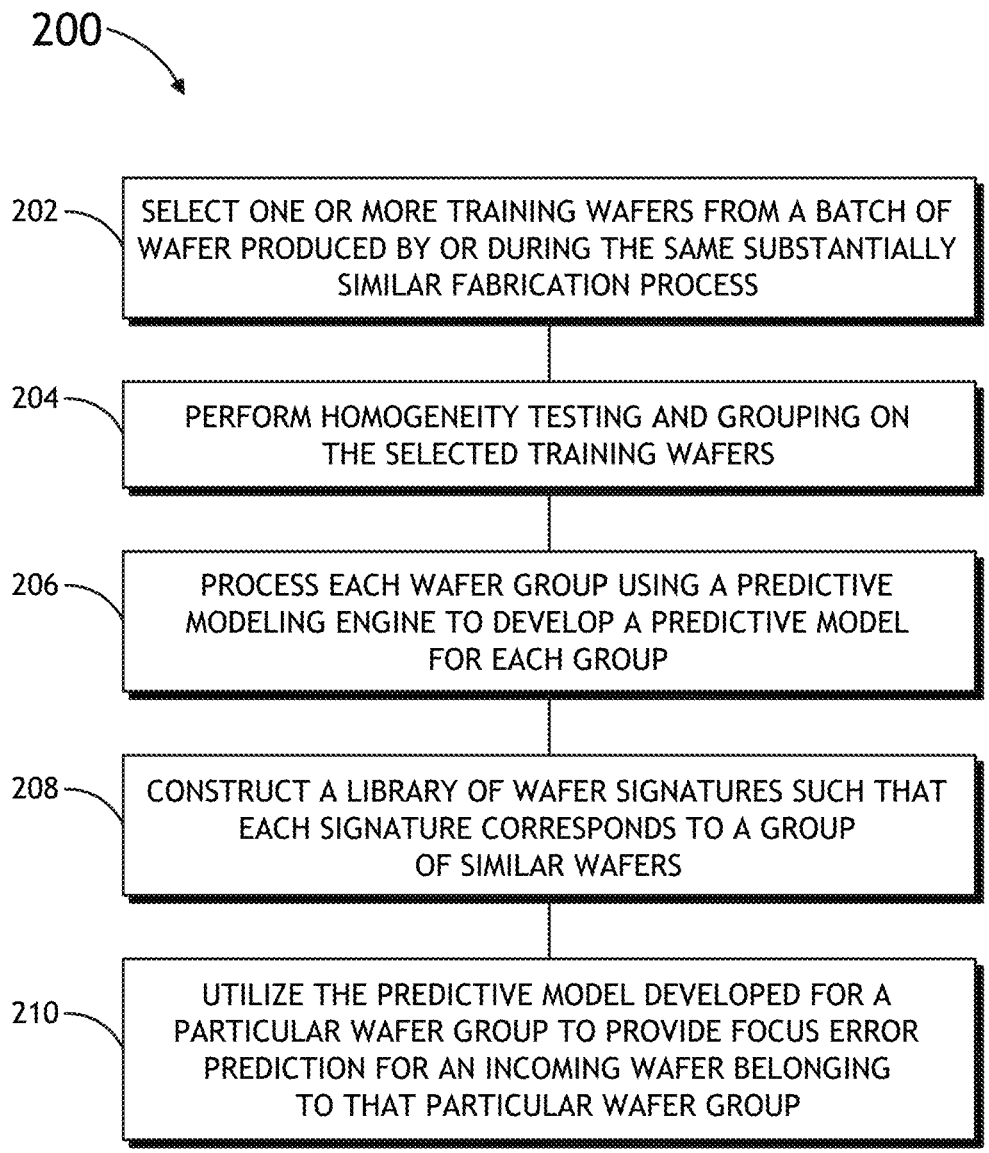
FIG. 2 is a flow diagram depicting a method for focus error prediction/estimation.

More specifically, referring to FIG. 2, a flow diagram depicting a method 200 for focus error prediction/estimation is shown. In at least one embodiment of the present invention, one or more training wafers are selected in step 202 from a batch of wafers produced by or during the same or substantially similar fabrication process. A dynamically smart sampling strategy may be employed to select the training wafers. Patterned wafer geometry parameters such as wafer shape and geometry can be obtained for the selected training wafers using a patterned wafer geometry metrology tool.

In certain embodiments, the selected training wafers may also undergo homogeneity testing and grouping in step 204. More specifically, if it is determined that the selected training wafers behave heterogeneously (for example due to different chambers of a multi-chamber process tool imparting different process signatures on the wafers in a single lot), statistical clustering techniques may be applied to separate training wafers into several homogenous groups. The reason that the selected training wafers may behave heterogeneously is because during semiconductor manufacturing processes, wafers go through numerous chemical and mechanical process steps. Variations are created in each process step. For example, a process may have multiple chambers with different characteristics. These disparities often make a batch or wafers in a lot exhibit grouping phenomenon. Wafers that have gone through similar processes may fall into the same group, which may have different properties than wafers in other groups. Therefore, it may be beneficial in certain embodiments to separate wafers with different characteristics during wafer inspection and metrology. Homogeneity testing may be crucial for a replicable predictive model.

It is contemplated that the homogeneity testing of the wafers may be performed based on wafer geometry measurements obtained from the wafers. Alternatively and/or additionally, the homogeneity testing of the wafers may be performed based on overlay errors that have been observed/ predicted for the wafers. It is also contemplated that various types of statistical clustering techniques may be utilized to separate training wafers into several homogenous groups. In one example, if the objective is to group the wafers into a known number of groups, K-means algorithm may be utilized. On the other hand, if the number of groups is unknown but high similarities between wafers are required, an algorithm that leverages a process for finding maximal cliques in a graph is a good choice. In other examples, if densities of wafer characteristics are approximately normally distributed, Gaussian Mixture Model is a good choice, and if grouping relies on many wafer characteristics instead of a single one, Spectral Clustering may be ideal.

For illustrative purposes, a grouping process utilizing a maximal cliques finding algorithm is described below as an example. It is understood, however, that various other suitable algorithms may also be utilized to perform homogenous grouping without departing from the spirit and scope of the present invention.

Figure 3:
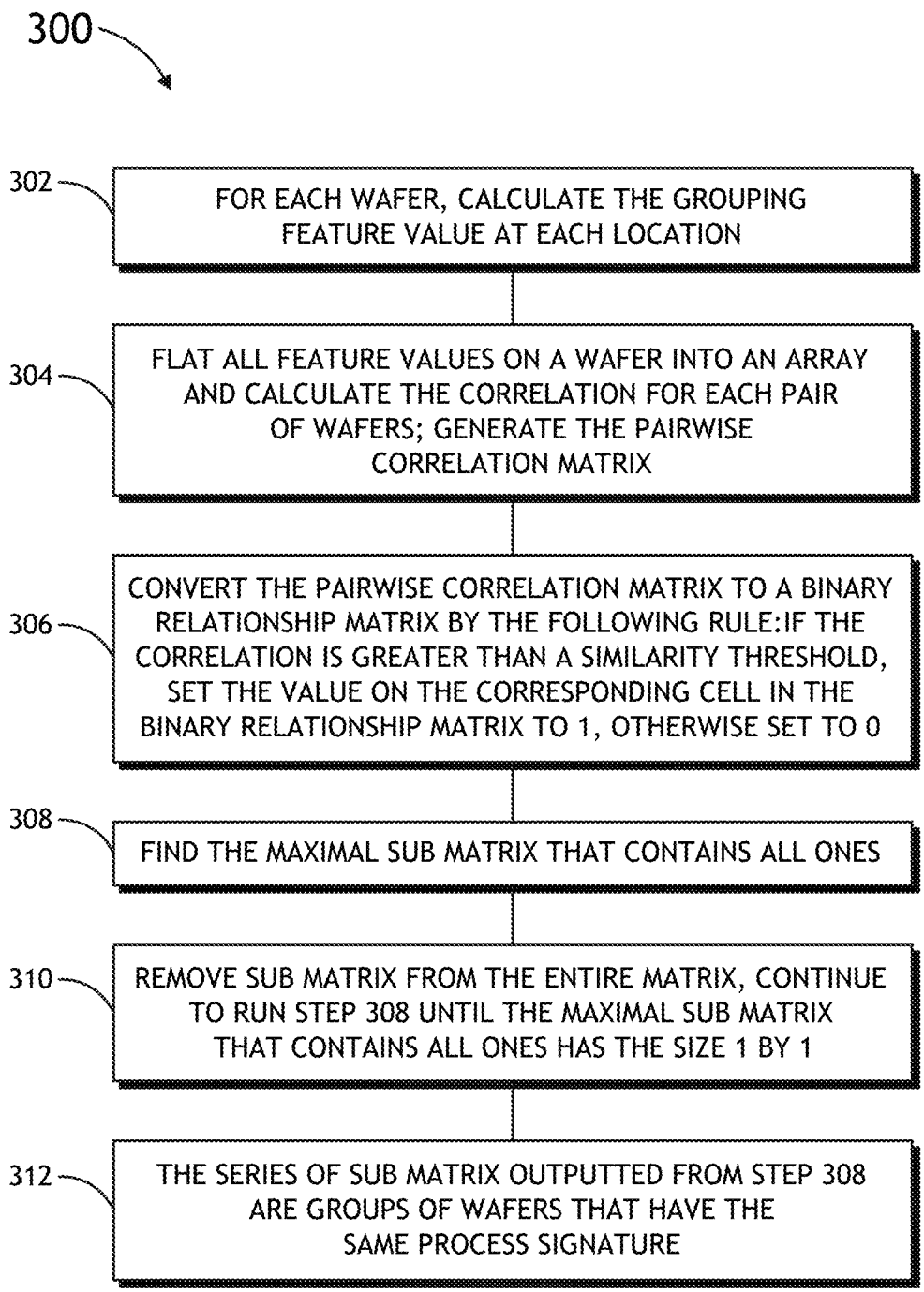
FIG. 3 is a flow diagram depicting an auto-grouping process.

In graph theory, complete sub graphs of a graph, are of great importance in many applications as they represent closely connected clusters of similar characteristics. In such cases, the maximal cliques finding algorithm searches the maximal connected sub graph. In a graph representation of automatic grouping problem, a node in a graph represents the wafer and two nodes are connected when the two wafers share great similarities. Once this graph is constructed, finding a group of similar wafers is akin to finding a connected sub graph. FIG. 3 is a flow diagram depicting an auto-grouping process 300 that leverages the maximal cliques finding algorithm.

As illustrated in FIG. 3, the wafer characteristics (feature values) that are used for the grouping process are obtained for each wafer in step 302. Exemplary wafer characteristics used for the grouping process may include, but are not limited to, wafer shape and in-plane displacement measurements and the like. Subsequently, all the obtained feature values on a wafer are flattened into an array and are used to calculate the correlations between each pair of wafers in step 304 to generate a pair-wise correlation matrix. This pair-wise correlation matrix is then converted to a binary relationship matrix in step 306 by the following rule: if the correlation is greater than a predetermined similarity threshold, set the value on the corresponding cell in the binary relationship matrix to 1, otherwise, set it to 0. Based on this binary relationship matrix, the maximal sub matrix that contains all ones can be identified using the maximal cliques finding algorithm in step 308. Subsequently, the identified sub matrix can be removed from the entire matrix in step 310, and the process continues to run step 308 until the maximal sub matrix that contains all ones has the size of 1 by 1. At this point, the series of sub matrix outputted from step 308 are groups of wafers that have the same process signature, and the auto-grouping process terminates in step 312.

To reiterate, process 300 using the maximal cliques finding algorithm for auto-grouping is presented above for illustrative purposes. It is contemplated that various other suitable algorithms may also be utilized to perform homogenous grouping without departing from the spirit and scope of the present invention.

Referring back to FIG. 2, once the homogeneity testing and grouping (step 204) is completed, each group of wafers can be processed by the predictive modeling engine to develop a predictive model for each group in step 206. The development and usage of an exemplary predictive model for error prediction is described in: Statistical overlay error prediction for feed forward and feedback correction of overlay errors, root cause analysis and process control, W. Chang et al., U.S. patent application Ser. No. 14/220,665, which is herein incorporated by reference in its entirety. It is to be understood, however, that various other types of predictive modeling engines may be utilized without departing from the spirit and scope of the present disclosure. Predictive modeling engines may implement advanced predictive models including, but not limited to, neural network, random forest, boosted regression tree, support vector machine and generalized linear or non-linear models.

Predictive models may take a large number of process dependent variables, including a multitude of high spatial resolution wafer geometry parameters, as input variables such as, but not limited to, wafer flatness, thickness, shape, and their first or higher order derivatives, difference in shape (post-process minus pre-process), shape residual (post 2nd order removal) and other relevant process information (such as but not limited to chip layout, film-stack thickness and other properties, lithography scanner settings and the like). The predictive results generated from the predictive modeling engine help establishing the contribution of and correlation between wafer geometry parameters (e.g., wafer flatness) to focus errors.

It is contemplated that the accuracy of the predictive model developed for each particular training group may be measured by predicting focus errors of the wafers within that particular training group using the predictive model and comparing the predicted results against the actual measured focus errors. It is also contemplated that the predictive model may allow for flexible experimentation. That is, the number of training wafers can be gradually increased until reaching reliable prediction performance. In the training phase, wafer geometry and process characteristics of interest are identified. Different sampling strategies based on those characteristics may be rapidly tested to converge to the most optimal prediction performance in terms of accuracy and reliability. Optimal sampling may define the minimum number of points at which wafer geometry changes need to be measured and thus reduce cycle time and increase tool productivity.

It is further contemplated that the accuracy of the predictive model developed for each group may also be measured by predicting focus errors of one or more validation wafers outside of the training group. The predictive model may be used to predict the focus errors of the one or more validation wafers and compare the predicted results with the actual focus errors measured for the validation wafers. If the prediction accuracy satisfies a predefined threshold, the predictive model is considered to be valid and ready to be deployed to predict focus errors on other wafers which share similar processing conditions with the training and validation wafers.

It is understood that if the homogeneity testing and grouping separated the training wafers into a plurality of groups, a predictive model may be generated for each group in step 206. In addition, a library of wafer signatures may be constructed in step 208 such that each signature corresponds to a group of similar wafers. In this manner, upon receiving a new wafer in step 210, measurements obtained from this new wafer can be compared against the wafer signature library to determine which group the new wafer belongs to. Subsequently, the predictive model generated for the group which the new wafer belongs to can be utilized to predict the focus error for the new wafer. In the event that incoming wafers do not have matching signatures in the library, the library of wafer signatures and associated predictive models may be expanded, for example, by re-sampling or expanding the training wafer set.

It is noted that the predictive modeling based focus error prediction method and system described above are effective because wafer geometry measurements and in particular wafer flatness correlates to focus errors. It is also noted that the predictive modeling based focus error prediction method and system in accordance with the present invention improves prediction accuracy by taking into consideration various wafer geometry parameters and homogenous grouping.

Figure 4:
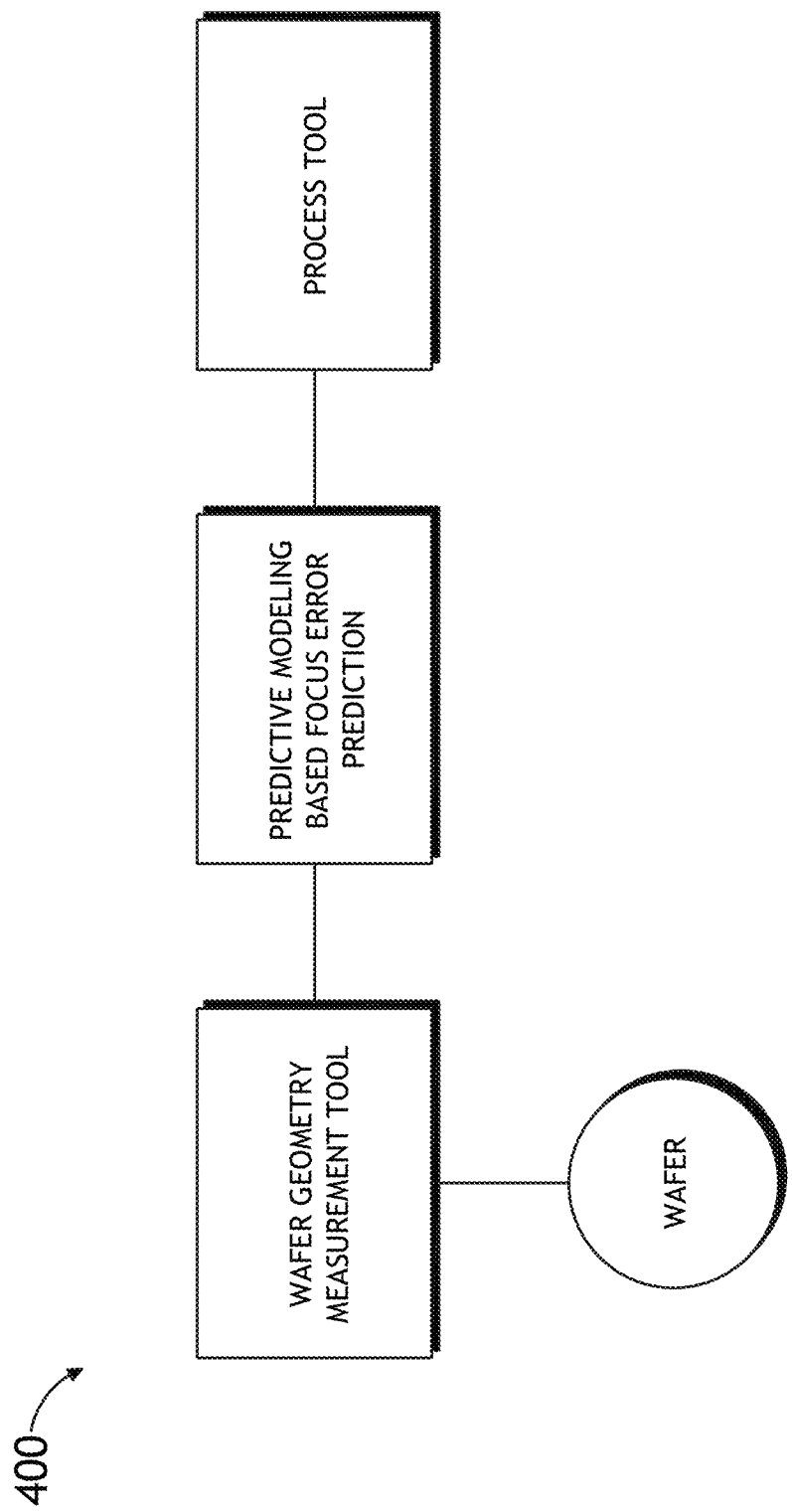
FIG. 4 is a block diagram depicting a system utilizing predictive modeling based focus error prediction.

FIG. 4 is a block diagram depicting a system 400 utilizing predictive modeling based focus error prediction as described above. It is contemplated that the predictive model(s) constructed can be utilized for controlling various process tools, including, but not limited to, lithography focus control, CMP, as well as other semiconductor process control scanner corrections.

It is contemplated that while some of the examples above referred to lithography tools, the systems and methods in accordance with the present disclosure are applicable to other types of process tools, which may also benefit from the focus error controls without departing from the spirit and scope of the present disclosure. Furthermore, the term wafer used in the present disclosure may include a thin slice of semiconductor material used in the fabrication of integrated circuits and other devices, as well as other thin polished plates such as magnetic disc substrates, gauge blocks and the like.

The methods disclosed may be implemented in various wafer geometry measurement tools as sets of instructions executed by one or more processors, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A predictive modeling based focus error prediction method, comprising:
   obtaining wafer geometry measurements of a plurality of training wafers;
   grouping the plurality of training wafers to provide at least one training group based on relative homogeneity of wafer geometry measurements among the plurality of training wafers;
   for each particular training group of the at least one training group, developing a predictive model for that particular training group utilizing non-linear predictive modeling, the predictive model establishing correlations between wafer geometry parameters and focus error measurements obtained for each wafer within that particular training group; and utilizing the predictive model developed for a particular training group of the at least one training group to provide focus error prediction for an incoming wafer belonging to that particular training group.

2. The method of claim 1, wherein the grouping step further comprises:
calculating correlations between each pair of wafers within the plurality of training wafers to generate a pair-wise correlation matrix;
converting the pair-wise correlation matrix to a binary relationship matrix based on whether each pair-wise correlation is greater than a predetermined similarity threshold;
identifying a maximal sub matrix containing all binary values of one from the binary relationship matrix;
identifying the wafers corresponding to the identified maximal sub matrix as being in a homogenous group;
removing the identified maximal sub matrix from the binary relationship matrix; and
repeating the steps of: identifying a maximal sub matrix containing all binary values of one from the binary relationship matrix and identifying the wafers corresponding to the identified maximal sub matrix as being in a homogenous group.

3. The method of claim 2, wherein the correlations between each pair of wafers within the plurality of training wafers are calculated at least partially based on wafer flatness measurements of the plurality of training wafers.

4. The method of claim 1, further comprising:
validating the predictive model developed for a particular training group of the at least one training group prior to utilizing the predictive model for focus error prediction.

5. The method of claim 4, wherein validating the predictive model developed for a particular training group further comprises:
validating the predictive model based on at least one wafer within the particular training group.

6. The method of claim 4, wherein validating the predictive model developed for a particular training group further comprises:
validating the predictive model based on at least one wafer outside of the particular training group.

7. The method of claim 1, further comprising:
providing the focus error prediction for the incoming wafer to control a wafer process tool.

8. The method of claim 7, wherein the wafer process tool is a lithography process tool.

9. The method of claim 1, wherein the non-linear predictive modeling utilizes at least one of: a neural network, a random forest, a boosted regression tree and a support vector machine.

10. The method of claim 1, wherein said grouping the plurality of training wafers is based on relative homogeneity of wafer geometry measurements among the plurality of training wafers and further based on relative homogeneity of overlay errors among the plurality of training wafers.

11. A method, comprising:
obtaining wafer geometry measurements of a plurality of wafers;
calculating correlations between each pair of wafers within the plurality of wafers to generate a pair-wise correlation matrix based on wafer geometry measurements;
converting the pair-wise correlation matrix to a binary relationship matrix based on whether each pair-wise correlation is greater than a predetermined similarity threshold;
dividing the plurality of wafers into a plurality of wafer groups based on relative homogeneity among the plurality of wafers, further comprising:
identifying a maximal sub matrix containing all binary values of one from the binary relationship matrix;
identifying the wafers corresponding to the identified maximal sub matrix as being in a homogenous group;
removing the identified maximal sub matrix from the binary relationship matrix; and
repeating the steps of: identifying a maximal sub matrix containing all binary values of one from the binary relationship matrix and identifying the wafers corresponding to the identified maximal sub matrix as being in a homogenous group.

12. The method of claim 11, wherein the correlations between each pair of wafers within the plurality of training wafers are calculated at least partially based on wafer flatness measurements of the plurality of training wafers.

13. The method of claim 11, further comprising:
for each particular wafer group of the plurality of wafer groups, developing a predictive model for that particular wafer group utilizing non-linear predictive modeling, the predictive model establishing correlations between wafer geometry parameters and focus error measurements obtained for each wafer within that particular wafer group.

14. The method of claim 13, further comprising:
validating the predictive model developed for a particular wafer group.

15. The method of claim 14, wherein validating the predictive model developed for a particular wafer group further comprises:
validating the predictive model based on at least one wafer within the particular wafer group.

16. The method of claim 14, wherein validating the predictive model developed for a particular wafer group further comprises:
validating the predictive model based on at least one wafer outside of the particular wafer group.

17. The method of claim 13, further comprising:
utilizing the predictive model developed for a particular wafer group to provide focus error prediction for an incoming wafer belonging to that particular training group.

18. The method of claim 17, further comprising:
providing the focus error prediction for the incoming wafer to control a wafer process tool.

19. The method of claim 18, wherein the wafer process tool is a lithography process tool.

20. A system, comprising:
a wafer geometry measurement tool configured to obtain wafer geometry measurements of a plurality of training wafers; and
a processor in communication with the wafer geometry measurement tool, the processor configured to:
group the plurality of training wafers to provide at least one training group based on relative homogeneity of wafer geometry measurements among the plurality of training wafers;
for each particular training group of the at least one training group, develop a predictive model for that particular training group utilizing non-linear predictive modeling, wherein the predictive model establishes correlations between wafer geometry parameters and focus error measurements obtained for each wafer within that particular training group; and utilize the predictive model developed for a particular training group of the at least one training group to provide focus error prediction for an incoming wafer belonging to that particular training group.

21. The system of claim 20, wherein to group the plurality of training wafers, the processor is further configured to:
a) calculate correlations between each pair of wafers within the plurality of training wafers to generate a pair-wise correlation matrix;
b) convert the pair-wise correlation matrix to a binary relationship matrix based on whether each pair-wise correlation is greater than a predetermined similarity threshold;
c) identify a maximal sub matrix containing all binary values of one from the binary relationship matrix;
d) identify the wafers corresponding to the identified maximal sub matrix as being in a homogenous group;
e) remove the identified maximal sub matrix from the binary relationship matrix; and
f) repeat steps d) through e).

22. The system of claim 21, wherein the correlations between each pair of wafers within the plurality of training wafers are calculated at least partially based on wafer flatness measurements of the plurality of training wafers.

23. The system of claim 20, wherein the processor is further configured to:
validate the predictive model developed for a particular training group of the at least one training group prior to utilize the predictive model for focus error prediction.

24. The system of claim 23, wherein the processor is configured to validate the predictive model based on at least one wafer within the particular training group.

25. The system of claim 23, wherein the processor is configured to validate the predictive model based on at least one wafer outside of the particular training group.

26. The system of claim 20, wherein the processor is further configured to:
provide the focus error prediction for the incoming wafer to control a wafer process tool.

27. The system of claim 26, wherein the wafer process tool is a lithography process tool.

28. The system of claim 20, wherein the processor is configured to group the plurality of training wafers to provide at least one training group based on relative homogeneity of wafer geometry measurements among the plurality of training wafers and further based on relative homogeneity of overlay errors among the plurality of training wafers.

* * * * *